United States Patent [19]

Bodenhausen et al.

[11] Patent Number: 5,448,170
[45] Date of Patent: Sep. 5, 1995

[54] METHOD FOR EXCITING TRANSVERSE MAGNETIZATION IN MAGNETIC RESONANCE

[75] Inventors: Geoffrey Bodenhausen, Pully; Vladimir I. Ermakov, Lausanne, both of

[73] Assignee: Spectrospin AG, Fallanden, Switzerland

[21] Appl. No.: 164,137

[22] Filed: Dec. 8, 1993

[51] Int. Cl.[6] .................................. G01V 3/00
[52] U.S. Cl. ...................... 324/309; 324/307; 324/314
[58] Field of Search ............ 324/300, 307, 308, 309, 324/312, 314

[56] References Cited

U.S. PATENT DOCUMENTS

| | | | |
|---|---|---|---|
| 4,345,207 | 8/1982 | Bertrand et al. | 324/308 |
| 4,940,940 | 7/1990 | Leroux | 324/309 |
| 5,126,671 | 6/1992 | Bodenhausen et al. | 324/309 |
| 5,280,245 | 1/1994 | Pauly | 324/314 |

FOREIGN PATENT DOCUMENTS 0394504 10/1990 European Pat. Off. ..... G01R 33/46
9201235 1/1992 WIPO ..................... G01R 33/46

OTHER PUBLICATIONS

Journal of Magnetic Resonance, vol 84, No. 1, 1 Aug. 1989 Orlando, Minn. 10 US, pp. 191–197.
Journal of Magnetic Resonance, vol. 90, No. 1, 15 Oct. 1990, Orlando US, pp. 183–191.
Journal of Magnetic Resonance, vol. 82, pp. 174–179.
J. Chemical Physics, vol. 93, No. 11, 1 Dec. 1990, New York, US pp. 7687–7697.
Chemical Physics Letters, vol. 204, No. 3, 4, 19 Mar. 1993, Amsterdam, NL, pp. 375–380.

*Primary Examiner*—Louis Arana
*Attorney, Agent, or Firm*—Bookstein & Kudirka

[57] ABSTRACT

A method for exciting transverse magnetization by irradiating a nuclear spin system subjected to a constant magnetic field with a frequency-modulated rf-pulse ("chirp"-pulse) and with a further frequency-modulated rf-pulse (further chirp-pulse) for refocusing the magnetization, is characterized in that the rf-pulse-(P1) and the further rf-pulse (P2) overlap each other in time at least partially. Thus, the duration of the pulses can be reduced.

11 Claims, 4 Drawing Sheets

5,448,170

METHOD FOR EXCITING TRANSVERSE MAGNETIZATION IN MAGNETIC RESONANCE

BACKGROUND OF THE INVENTION

In nuclear magnetic resonance, the excitation of transverse magnetization over very large bandwidths represents a difficult challenge, particularly if it is essential to the success of the experiment that the phase of the magnetization be independent of offset. (Offset is the difference between the carrier frequency of the excitation rf pulse and the frequency of the excited spins.) Excitation with a simple radio-frequency pulse gives rise to a significant phase-dispersion if the offset exceeds the amplitude of the rf field. If the signals are recorded immediately after excitation, it is possible to compensate the resulting frequency dependence of the phase across the spectrum by standard phase-correction procedures. However, if the initial excitation is followed by spin-locking or various coherence transfer sequences, the initial phase-dispersion of the magnetization may lead to deleterious effects.

With the advent of "composite pulses", it has become possible to combat the effects of phase-dispersion very effectively (see M. H. Levitt, Progr. NMR Sectrose. 18 (1986) 61, which is hereby incorporated by reference herein). Composite pulses are comprised of sequences of closely-spaced radio-frequency pulses with different phases and durations, but where the rf amplitude and carrier frequency are usually constant. Generally speaking, the rf amplitudes used in composite pulses tend to be high, so that powerful amplifiers are required, and the effects on the sample are not always harmless, particularly for biological systems or samples at very low temperatures. The invention provides an alternative approach which requires much lower rf amplitudes.

In a variety of magnetic resonance experiments, it has been demonstrated that it can be advantageous to replace non-selective pulses by frequency-modulated "chirp" pulses (see J.-M. Böhlen, M. Rey and G. Bodenhausen, J. Magn. Reson. 84 (1989) 191, I. Burghardt, J.-M. Böhlen and G. Bodenhausen, J. Chem. Phys. 93 (1990) 7687, and G. Bodenhausen, J.-M. Böhlen and M. Rey, U.S. Pat. No. 5,126,671, Jun. 30, 1992, which are hereby incorporated by reference herein). The rf frequency of a chirp pulse is swept from a lower rf frequency to a higher rf frequency or vice versa within a predetermined time. Chirp pulses allow one to excite and refocus magnetization over very large bandwidths using limited radio-frequency amplitudes. While they have numerous advantages, sequences of chirp pulses also have their "Achilles' heel" since they tend to have a long duration. As a result, the experiments tend to be prone to signal losses due to transverse relaxation.

It is an object of the invention to avoid or reduce such signal losses.

SUMMARY OF THE INVENTION

In a method for exciting transverse magnetization by irradiating a nuclear spin system subjected to a constant magnetic field with a frequency-modulated rf-pulse ("chirp"-pulse) and with a further frequency-modulated rf-pulse (further chirp-pulse) for refocusing the magnetization, this object is met according to the invention which is characterized in that the chirp-pulse and the further chirp-pulse overlap each other in time at lease partially.

The invention provides a procedure which allows one to reduce the duration of chirp pulse sequences to diminish relaxation effects.

Preferably the chirp-pulses end approximately at the same time. Thus, the total length in time of the pulses can be maximally reduced. However, it may be advantageous that the further chirp-pulse ends after the chirp-pulse.

Preferably, the speed of variation of the frequency of the further chirp-pulse is greater than the speed of variation of the chirp pulse by approximately double the speed of variation of frequency of the chirp-pulse.

In addition, the amplitude of the further chirp-pulse is preferably greater than the amplitude of the chirp-pulse, by approximately three to four times the amplitude of the chirp pulse.

With reference to a time-amplitude-diagram, at lease one edge of at least one of the chirp-pulse and further chirp-pulse preferably has a shape different from a rectangle with respect to the time-coordinate.

Moreover, at least one edge of at least one of the chirp-pulse and further chirp-pulse has a smooth transition with respect to the time coordinate or the time-amplitude-diagram.

It is advantageous if at least one edge of at least one of the chirp-pulses rises according to the first quarter of a sine-wave, respectively.

An embodiment of the invention provides that phase-cycling is performed according to the method of EXORCYCLE.

Preferably, the sweep rate, (that is the change in frequency per unit time) of at least one of the chirp-pulses is varied as a function of time.

According to another aspect and related embodiment of the invention, a method for exciting transverse magnetization by irradiating the nuclear spin system subjected to a constant magnetic field with a frequency-modulated rf-pulse ("chirp"-pulse) may be characterized in that the rf-pulse is double-frequency modulated.

The general principle of contraction is also applicable to more sophisticated sequences of chirp pulses, including those designed for the excitation and reconversion of multiple-quantum coherences (see I. Burghardt, J.-M. Böhlen and G. Bodenhausen, J. Chem. Phys. 93 (1990) 7687, which is hereby incorporated by reference herein).

The invention will now be described by way of example with reference to the accompanying drawings.

BRIEF DESCRIPTION OF THE DRAWINGS

The above and further advantages of the invention may be better understood by referring to the following description in conjunction with the accompanying drawings, in which:

FIG. 4b shows offset-dependence ("profile") of a signal excited by doubly-frequency-modulated pulses of the type shown in FIGS. 3c and 3d;

FIG. 4f shows offset-dependence (profiles) of signals excited by pulses similar to FIG. 1a.

DETAILED DESCRIPTION OF ILLUSTRATIVE EMBODIMENTS

FIGS. 1a–1d show schematic pulse sequences for exciting transverse magnetization with frequency-modulated pulses. The diagrams indicate the time-dependence of irradiation frequency $\omega_{rf}$ and rf amplitude $\omega_1$ of the excitation and refocusing components.

Figures 1A, 1B, 1C, 1D:
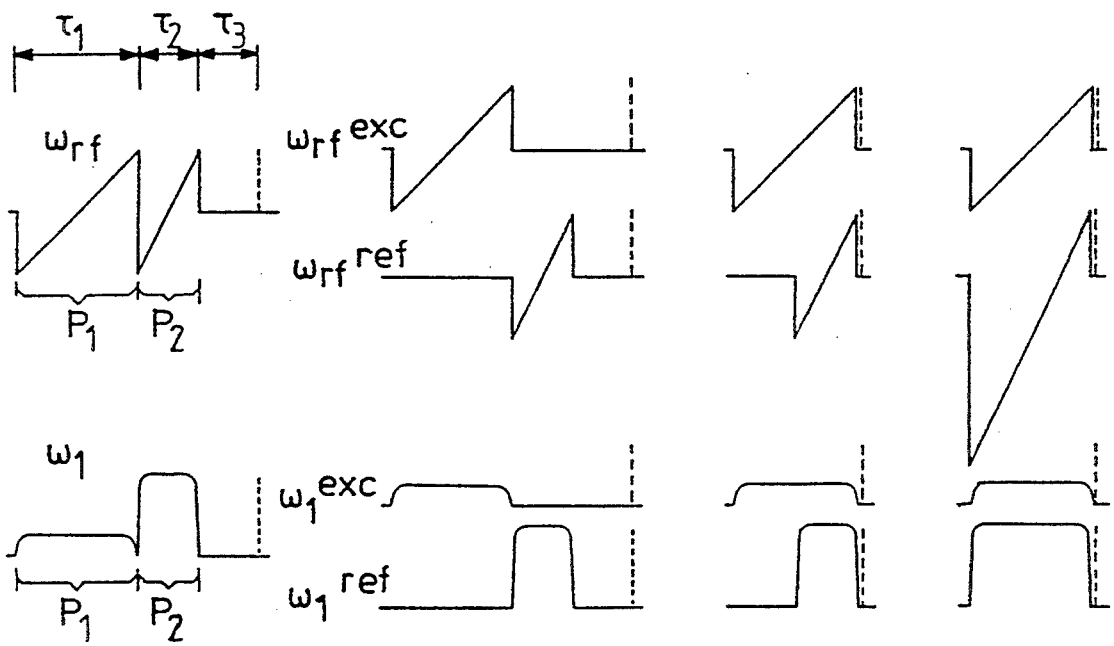
FIG. 1a shows a basic experiment with two linear frequency sweeps that are applied sequentially (state of the art)
FIG. 1b shows the same basic experiment drawn on two separate "staves", one for the chirp pulse (excitation pulse), the other for the further chirp pulse (refocusing pulse)
FIG. 1c shows a contracted experiment with partial superposition of the excitation and refocusing components according to the invention.
FIG. 1d shows a doubly-frequency-modulated self-refocusing pulse derived from (c) by extending the sweep of the refocusing component according to the invention.

FIG. 1a is a basic experiment with two linear frequency sweeps with apodized amplitude profiles (i.e. the profiles are non-rectangular) that are applied sequentially. The vertical dashed line indicates the time of the echo, where the phase dispersion of the magnetization is smallest, the horizontal axis is the time, the vertical axes show the rf frequency $\omega_{rf}$ (top of figure) and the amplitude $\omega_1$ (bottom of figure).

FIG. 1a shows a sequence comprising two chirp pulses, where a chirp pulse P1 (the first pulse) excites transverse magnetization, while a further chirp pulse P2 leads to refocusing (see J.-M. Böhlen, M. Rey and G. Bodenhausen, J. Magn, Reson, 84 (1989) 191, which is hereby incorporated by reference herein). The further chirp pulse P2 is swept twice as fast as the chirp pulse P1 as indicated by the steeper slope of the further chirp pulse in the $\omega_{rf}$-diagram, where the (first) chirp pulse P1 of duration $\tau_1$ is twice as long as the further chirp pulse (duration $\tau_2$). Moreover, the amplitude of P2 is three to four times larger than that of P1 (as shown in the $\omega_1$ diagram), and the phase of the magnetization at the time of the echo (indicated by a vertical dashed line) is approximately independent of the offset (see J.-M. Bohlen, M. Rey and G. Bodenhausen, J. Magn, Reson, 84 (1989) 101, which is hereby incorporated by reference herein). This echo occurs at a time $\tau_3 \approx \tau_2 = (\frac{1}{2})\tau_1$ after the end of the further chirp pulse P2.

The frequency-dependence of the phase at the time of the echo can be reduced if at least one, and preferably more than one, of the following measures are taken: (a) the edges of the rf pulses are "apodized"; i.e., they rise and fall, respectively, with a smooth shape and preferably with a curve as can be provided by multiplying the amplitude of a pulse having a rectangular envelope with parts of a sinusoidal waveform; (b) phase-cycling is used in the manner of EXORCYCLE (see G. Bodenhausen, R. Freeman and D. L. Turner, J. Magn, Reson, 27 (1977) 511, which is hereby incorporated by reference herein); (c) the sweep rate of the further chirp pulse is varied in a non-linear fashion. In this example, only measures (a) and (b) are taken. However, in spite of all these improvements, the echo amplitude may be affected adversely by transverse $T_2$ relaxation. The overall duration of the experiment in FIG. 1a is $\tau_1 = \tau_2 = \tau_3 = 2\tau_1$; for two magnetization vectors that are excited at the beginning and at the end of the (first) chirp pulse, the attenuation factors will be approximately exp $\{-2\tau_1/T_2\}$ and exp $\{-\tau_1/T_2\}$, respectively (see J.-M. Böhlen, I. Burghardt, M. Rey and G. Bodenhausen, J. Chem. Phys. 90 (1990) 183, which is hereby incorporated by reference herein).

We can partly overcome the difficulty of a contraction of chirp pulse sequences by shifting both the chirp and further chirp pulses along the time axis. This contraction process is best explained in graphical terms.

FIG. 1b shows a sequence that is in all respects identical to the basic sequence of FIG. 1a, but where the time-dependence of $\omega_{rf}$ and $\omega_1$ have been drawn on separate "staves" for the chirp and further chirp pulses, similar to the notation for the left and right hands of piano music. Both staves are in the same "key", since both pulses cover the same scale of frequencies. Thus, the left-most ends of the graphs for $\omega_{rf}^{exc}$ and $\omega_{rf}^{ref}$ in FIGS. 1b, 1c, 1d characterize exactly the same frequency as the leftmost end of the graph for $\omega_{rf}$ of FIG. 1a. The horizontal lines of the above-mentioned graphs correspond to an offset zero on the vertical axis, which itself is not shown.

FIG. 1c demonstrates what is meant by contraction: the chirp and further chirp pulses are shifted along the horizontal time axis so that they partly overlap to form a single pulse with double frequency modulation. The echo now occurs immediately after the end of the further chirp pulse, so that the overall duration of the experiment is reduced by a factor two.

It turns out that profiles obtained with the sequence of FIG. 1c were rather disappointing. This could be attributed in part to the discontinuity in the rf amplitude and to "edge effects" that are associated with the beginning of the refocusing component, which starts in the middle of the excitation component.

Both of these problems can be circumvented with the sequence of FIG. 1d, where the refocusing component is extended backwards (towards the left side) both in time and frequency. Thus, while the frequency $\omega_{rf}(t)$ of the excitation component is swept between $\omega_{rf}^{min} = \omega_0 - (\frac{1}{2}\Delta\omega)$ and $\omega_{rf}^{max} = \omega_0 + (\frac{1}{2})\Delta\omega$, the refocusing component is swept approximately from $\omega_{rf}^{min} = \omega_0 - (3/2)\Delta\omega$ to $\omega_{rf}^{max} = \omega_0 + (\frac{1}{2}\Delta\omega)$. A magnetization vector (corresponding to the spins of one specific resonance frequency) which resonates at the lower end of the range near $\omega_0 - (\frac{1}{2})\Delta\omega$, and which is excited at the very beginning of the pulse, is already refocused in the middle of that pulse. At this time, a magnetization vector resonating near $\omega_0$ is just being excited, while a vector resonating at the upper end of the range near $\omega_0 + (\frac{1}{2})\Delta\omega$ is still in thermal equilibrium. Thus, FIG. 1d shows a doubly-frequency-modulated self-refocusing pulse derived from FIG. 1c by extending the sweep of the refocusing component.

For simplicity, the schematic graphs in FIG. 1d show two components that are exactly superimposed. In actual fact, the refocusing component is advantageously stretched somewhat, so that it reaches the upper frequency limit briefly after the excitation component, in order to reduce interference effects and to overcome problems due to receiver dead-time. As a result, a formation of the echo is slightly delayed after the end of the pulse.

Figure 2A:
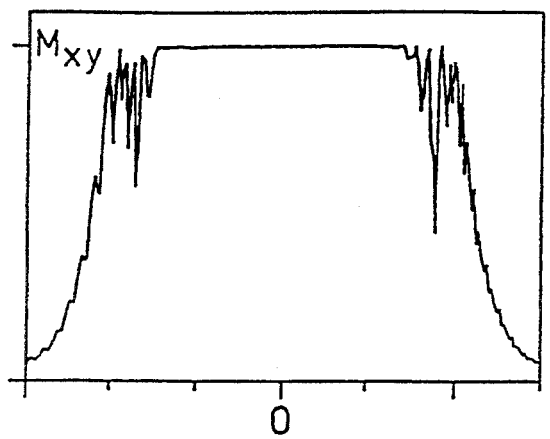
FIG. 2a shows a simulated profile of the magnitude and phase response of two consecutive chirp pulses.
Figure 2B:
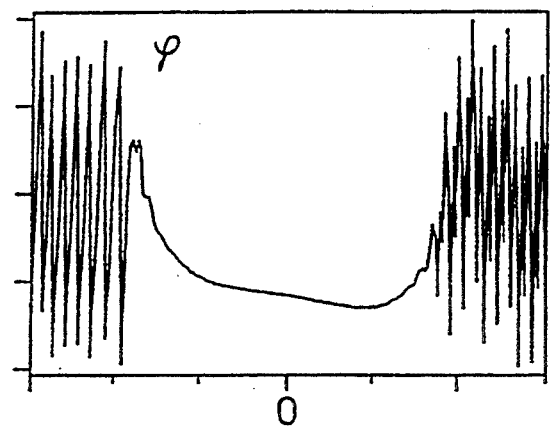
FIG. 2b shows a simulated profile of the magnitude and phase response of two consecutive chirp pulses.
Figure 2C:
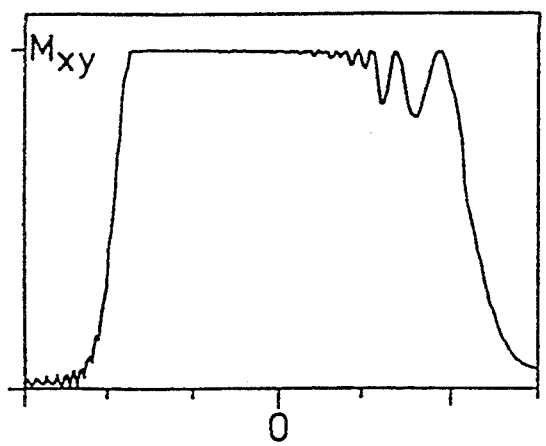
FIG. 2c shows a simulated profile of the magnitude and phase response for two simultaneous chirp pulses.
Figure 2D:
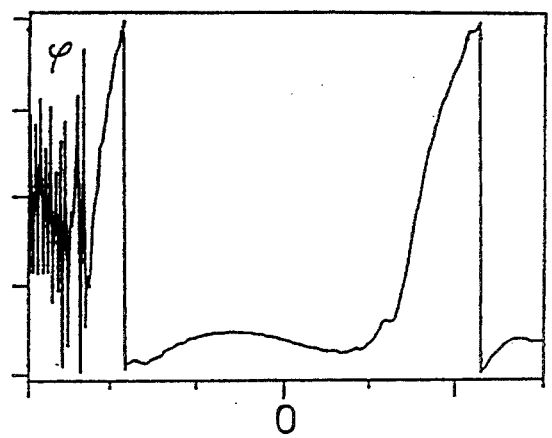
FIG. 2d shows a simulated profile of the magnitude and phase response for two simultaneous chirp pulses.

FIGS. 2a–2d show computer simulations of "profiles", i.e., of the magnitude and phase of the transverse magnetization as a function of offset. The simulated response for a sequence of two consecutive chirp pulses (as in FIG. 1a) is shown in FIGS. 2a and b, while the profile expected for two simultaneous chirp pulses (as in FIG. 1d) is shown in FIG. 2c and d.

FIG. 2a and c show magnitude $M_{xy}=(M_x^2+M_y^2)^{\frac{1}{2}}$; FIG. 2b and d show phase $\phi=\arctan M_y/M_x$, plotted in the interval $[-\pi, +\pi]$, all as a function of offset. Specifically, FIGS. 2a, b refer to a basic experiment with two sequential chirp pulses, as in FIG. 1a ($\tau_1=4$ ms, $\tau_2 2.075$ ms, $\tau_2=2$ ms, sinusoidal apodization of the initial and final 10% of each pulse, sweep range from $-20$ to $+20$ kHz, rf amplitudes $\omega_1^{exc}=0.85$ kHz and $\omega_1^{ref}=4.8$ kHz). FIGS. 2c, d refer to a contracted experiment with the refocusing component prolonged backwards, as in FIG. 1d, with the same sweep rates and rf amplitudes as above, the excitation and refocusing components starting together but with the latter ending 139 μs after the excitation component. The linear part of the residual frequency-dependence of the phase in FIG. 2b can be removed by delaying the beginning of signal acquisition. Phase-cycling was not included in these simulations.

In practice, a simple chirp pulse can be obtained by programming the x- and y-components of an audio-frequency signal as a function of time with a linear frequency sweep corresponding to a parabolic time-dependence of the phase. The wave form is converted into a radio-frequency signal by an Oxford Research Systems selective excitation unit used in combination with a Bruker MSL 300 spectrometer.

Figure 3A:
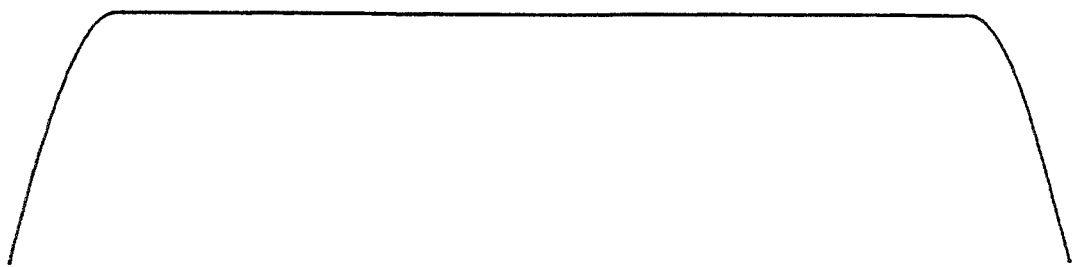
FIG. 3a shows amplitude of a single chirp pulse where the frequency is modulated as a linear function of time.
Figure 3B:
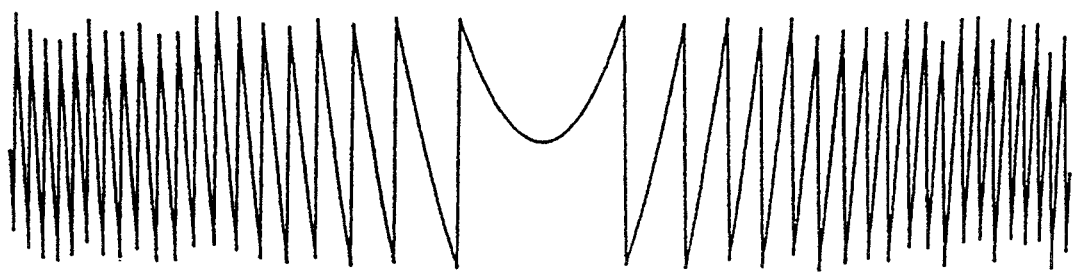
FIG. 3b shows phase of a simple chirp pulse where the frequency is modulated as a linear function of time.

FIG. 3a shows the time dependence of the amplitude and FIG. 3b of the phase of a simple chirp pulse, such as used for the initial excitation pulse P1 in FIG. 1a. The frequency is modulated as a linear function of time. Specifically, FIG. 3a shows how the rising and falling edges of the pulse were "apodized" by multiplying the amplitude in the initial and final 10% of the pulse length with the first and second quarter-periods of a sine wave. FIG. 3b shows the parabolic time-dependence of the phase, the discontinuities being due to the fact that only an interval $[-\pi, \pi]$ is represented along the ordinate. Note that the derivative changes sign in the center of the sweep, where the instantaneous frequency $\omega_{rf}$ coincides with the carrier frequency $\omega_0$. The $\omega_{rf}$ frequency was swept in 4 ms from $-20$ to $+20$ kHz.

The superposition of two frequency-modulated components, shown schematically in FIG. 1d, is implemented in practice by programming two phase-modulated pulses separately, and by adding the x- and y-components of the two wave forms separately.

Figure 3C:
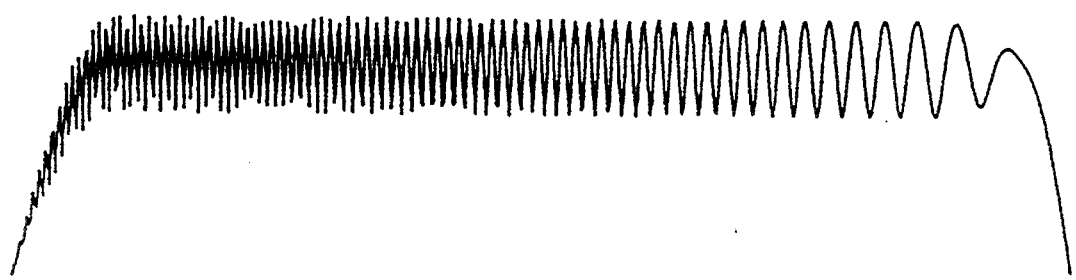
FIG. 3c shows amplitude of a doubly-frequency-modulated pulse.

FIG. 3c shows the time-dependence of the amplitude of the resulting double-frequency modulated rf field or pulse. Because one of the components has an approximately four-fold amplitude, the beat pattern due to the interference of the two frequencies appears to "ride" on an unmodulated shape reminiscent of FIG. 3a. (If the two components had equal amplitudes, FIG. 3c would simply have the appearance of a cosine function with a decreasing modulation frequency, since the difference between the two irradiation frequencies linearly decreases with time).

Figure 3D:
FIG. 3d shows phase of a doubly-frequency-modulated pulse.

FIG. 3d shows the phase of the rf field resulting from the superimposition of the two components, also as a function of time.

In practice, the excitation component was swept linearly at a rate of 10 kHz/ms over 40 kHz in 4 ms. The refocusing component was swept at 19.474 kHz/ms starting at $-60.623$ kHz, so that its frequency passes the lower edge of the excited range, where it begins to act on transverse magnetization, at $\tau=2.086$ ms after the beginning of the experiment. The frequency of the refocusing component therefore reaches the upper limit with a delay of 140 μs after the end of the excitation component, to avoid excessive interference. The overall length of the self-refocusing pulse is therefore 1.140 ms. In our experiments, the rf amplitudes were $\omega_1^{exc}=0.652$ kHz and $\omega_1^{ref}=2.874$ kHz. (kHz=kiloHertz, ms=milliseconds, μs=microseconds.)

To test the validity of the contraction process, we have recorded profiles experimentally, i.e., measured the offset-dependence of a narrow resonance line. The profiles in FIG. 4 were obtained by recording the proton spectrum of cydosporine in chloroform (see H. Kessler, H. R. Loosli and H. Oschkinat, Helv. Chim. Acta, 68 (1985) 661, which is hereby incorporated by reference herein), chosen because of its convenient spin-lattice relaxation time ($T_1 \approx 1$ s), and by focusing attention on a singlet resonance belonging to an $NCH_3$ group.

Figure 4A:
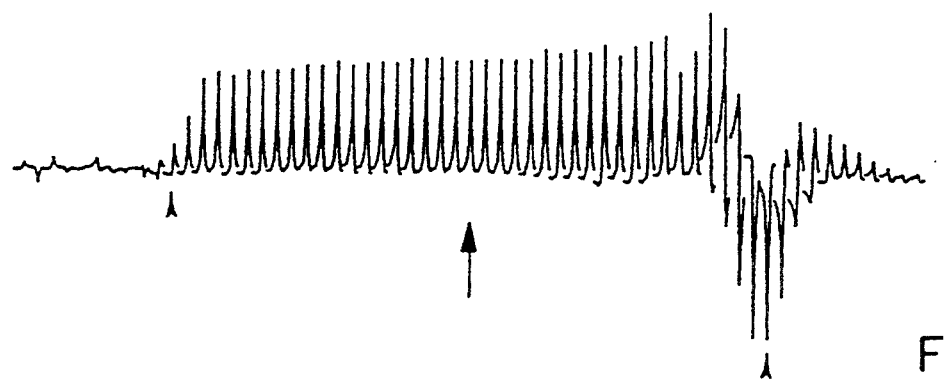
FIG. 4a shows offset-dependence ("profile") of a signal excited by doubly-frequency-modulated pulses of the type shown in FIGS. 3c and 3d.
Figure 4:
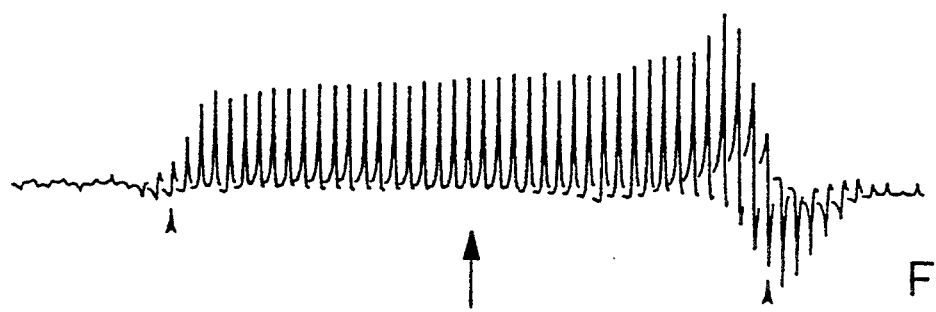
Figure 4C:
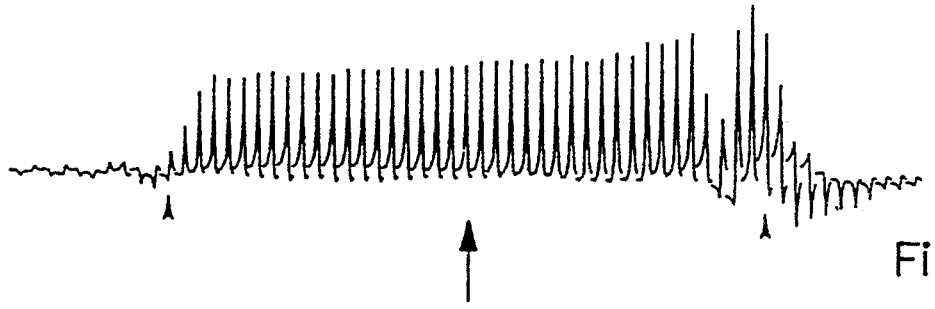
FIG. 4c shows offset-dependence ("profile") of a signal excited by doubly-frequency-modulated pulses of the type shown in FIGS. 3c and 3d.
Figure 4D:
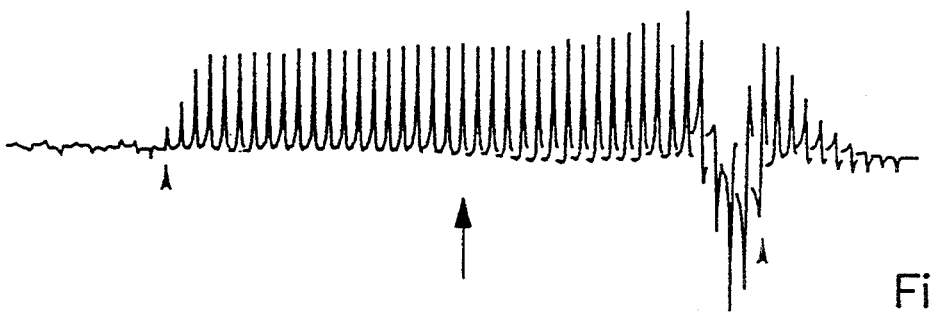
FIG. 4d shows offset-dependence ("profile") of a signal excited by doubly-frequency-modulated pulses of the type shown in FIGS. 3c and 3d.

FIG. 4a shows the profile (offset-dependence) obtained with the contracted spin-echo sequence of FIG. 1d, i.e., using the waveform shown in FIGS. 3c and d. The edges of the sweep of the excitation component are indicated by small arrows. The carrier frequency $\omega_0$ is indicated by a large arrow. We note rather severe phase distortions in the vicinity of the upper edge of the sweep, where the two components tend to merge, so that excitation and refocusing can no longer be separated properly.

A dramatic improvement of the profile can be obtained by phase-cycling in the manner of EXORCYCLE (see G. Bodenhausen, R. Freeman and D. L. Turner, J. Magn, Reson, 27 (1977) 511, which is hereby incorporated by reference herein). Normally, this consists in combining four complementary experiments, where the initial phase of the further chirp pulse is incremented in steps of 90° with respect to the phase of the chirp pulse (excitation pulse), while the signals are alternatively added and subtracted. In the contracted sequence of FIG. 1d, one can no longer speak of a phase-cycle in the usual sense, since the excitation and refocusing components are not separated in time and therefore cannot be phase-shifted independently. However, it is possible to compile four distinct waveforms similar to the waveform shown in FIGS. 3c and d, but where the relative phases of the constituent waveforms are shifted by 0°, 90°, 180° and 270° with respect to each other.

FIGS. 4a to d show the profiles obtained with four bursts of radio-frequency that differ in this manner, namely, excitation with four different self-refocusing doubly-frequency-modulated pulses, where the difference of the initial phases of the excitation and refocusing components was incremented through 0°, 90°, 180°, 270°, and where the receiver phase was alternated 0°, 180°, 0°, 180°.

Figure 4E:
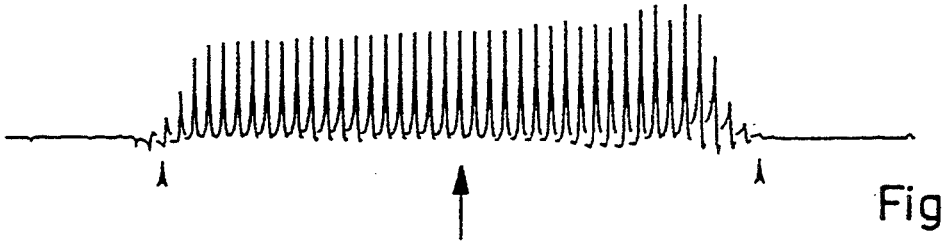
FIG. 4e shows offset-dependence ("profile") of a signal excited by doubly-frequency-modulated pulses of the type shown in FIGS. 3c and 3d.
Figure 4:
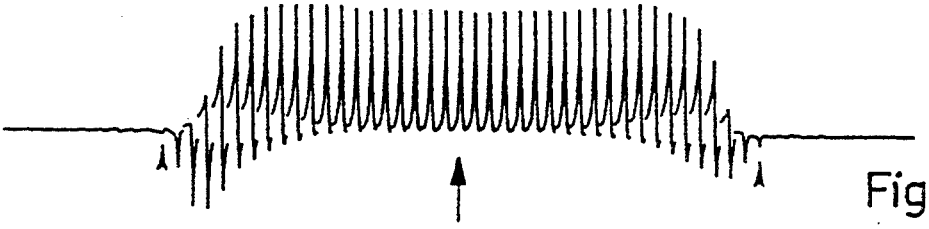

FIG. 4e shows the profile obtained by adding the signals recorded with these four experiments like in a conventional phase-cycle in the manner of EXORCYCLE. Thus, an improved profile is obtained. Clearly, the abstract concept of the separation of coherence transfer pathways (see G. Bodenhausen, H. Kogler and R. R. Ernst J. Magn. Reson. 58 (984) 370, which is hereby incorporated by reference herein) remains applicable even if the pulses are applied simultaneously.

All spectra were recorded with a spectral width of 62.5 kHz and 256 K (256 K = 256 × 1024 = 262144) data points; the plots only show small windows of 14 Hz width, which contain a singlet arising from an $NCH_3$ group of cyclosporine dissolved in chloroform. The carrier frequency $\omega_0$ (i.e., both the central frequency of the chirp pulses and the reference frequency of the detector) was stepped in increments of 1 kHz from $-30$ to $+30$ kHz with respect to the resonance frequency. Signal acquisition was started 50 μs after the pulse to compensate for propagation delays in the receiver system. The arrows indicate the edges of the sweep of the excitation component at $-20$ and $+20$ kHz; the carrier frequency $\omega_0$ appears in the middle of the figures and is indicated there. The refocusing component was swept from $-60.6$ to $+20$ kHz. The same frequency-independent phase correction was applied to all spectra, adjusted so that the on-resonance signal in the middle of the series was in pure absorption.

For comparison, FIG. 4f shows a profile obtained with the "uncontracted" spin-echo sequence of FIG. 1a also combined with phase cycling. Both profiles of FIGS. 4e and 4f suffer from a slight phase-dispersion as a function of offset. This could be compensated either by phase-correction after data acquisition, or by departing from simple linear frequency sweeps. We have not included this ultimate step towards improving the profile in our comparison, for the optimization would have to be carried out separately for both experiments, so that it would become difficult to compare the intrinsic virtues of two techniques.

It is worth noting however that the profile of the new experiment of FIG. 4e is better than its "uncontracted" counterpart in FIG. 4f. Of course, the new method has the additional advantage that the signals are less sensitive to relaxation.

The experiments were performed in constant high magnetic field BO of a cryomagnet which is parallel to the Z-axis of a fixed rectangular coordinate system. The X-axis and Y-axis are at right angles to each other and to the Z-axis. The chirp pulse and the further chirp pulse may be generated by one and the same coil which produces a magnetic field that is orthogonal to the Z-axis.

We have shown that transverse magnetization can be excited efficiently by a single self-refocusing pulse of low amplitude, consisting of the superposition of two frequency-modulated components. The phase and amplitude of the magnetization thus excited is essentially independent of frequency over a bandwidth that far exceeds the amplitude of the rf field. The principle of contraction can be applied to other experiments involving several chirp pulses.

Transverse magnetization can be excited with a single low-power radio-frequency pulse consisting of a superposition of two frequency-modulated components. The phase-dispersion obtained with this self-refocusing pulse is very small over bandwidths that are far greater than the amplitude of the radio-frequency field. The new pulse shapes may be derived from spin-echo sequences employing frequency-modulated "chirp" pulses by shifting the chirp and further chirp pulses in time so that they are partly or completely superimposed. The duration of chirp spin-echo sequences can be reduced by a factor of two by this contraction process, so that the echos are less sensitive to transverse relaxation.

The amplitudes of the chirp pulse and further chirp pulse can be given in units of magnetic field strength (Tesla), however, they are given here by applying the factor $\gamma$ (=magnetogyric ratio) as $\omega_1$ (unit: rad/sec).

What is claimed is:

1. A method for exciting transverse magnetization by irradiating a nuclear spin system, subjected to a constant magnetic field, with a first frequency-modulated rf-pulse (first "chirp"-pulse) and with a second frequency-modulated rf-pulse (second chirp-pulse) for refocusing the magnetization, wherein said first rf-pulse (P1) and said second rf-pulse (P2) at least partially overlap each other in time.

2. The method of claim 1, wherein the rf-pulses end approximately at the same time.

3. The method of claim 1, wherein the second rf-pulse ends after the first rf-pulse.

4. The method of claim 1, wherein a speed of variation of the frequency of the second chirp-pulse is greater than a speed of variation of the first chirp pulse.

5. The method of claim 4, wherein the speed of variation of frequency of the second chirp-pulse is approximately twice the speed of variation of frequency of the first chirp-pulse.

6. The method of claim 1, wherein a second amplitude of the second chirp-pulse is greater than a first amplitude of the first chirp-pulse.

7. The method of claim 6, wherein the second amplitude of the second chirp-pulse is approximately three to four times the first amplitude of the first chirp pulse.

8. The method of claim 1, wherein the edge of at least one of the first chirp-pulse and the second chirp-pulse, in a time-amplitude-diagram, has a shape different from a rectangle with respect to the time-coordinate.

9. The method of claim 8, wherein an edge of at least one of the first and the second chirp pulses rises with the dependence of a first quarter of a sine-wave and falls with the dependence of a second quarter of a sine-wave.

10. The method of claim 1, wherein a phase-cycling is performed according to an EXORCYCLE method.

11. The method of claim 1, wherein a sweep rate, that is the change in frequency per unit time, of at least one of the first and the second chirp pulses is varied as a function of time.

* * * * *

UNITED STATES PATENT AND TRADEMARK OFFICE
CERTIFICATE OF CORRECTION

PATENT NO. : 5,448,170
DATED : Sep. 5, 1995
INVENTOR(S) : Bodenhausen, et al.

It is certified that error appears in the above-indentified patent and that said Letters Patent is hereby corrected as shown below:

On cover page, add item [30] "Foreign Application Priority Data".

December 9, 1992 [EP] Europe.....................92 120 930.0

Signed and Sealed this

Twenty-seventh Day of February, 1996

Attest:

BRUCE LEHMAN

*Attesting Officer*    Commissioner of Patents and Trademarks